United States Patent [19]
Dent

[11] Patent Number: 5,748,134
[45] Date of Patent: May 5, 1998

[54] METHOD AND APPARATUS FOR CONVERTING AN ANALOG SIGNAL INTO DIGITAL FORMAT

[75] Inventor: Paul Wilkinson Dent, Stehag, Sweden

[73] Assignee: Ericsson Inc., Research Triangle Park, N.C.

[21] Appl. No.: 609,715

[22] Filed: Mar. 1, 1996

[51] Int. Cl.⁶ .................................................. H03M 1/40
[52] U.S. Cl. ........................................... 341/172; 341/164
[58] Field of Search ...................................... 341/157, 164, 341/172

[56] References Cited

U.S. PATENT DOCUMENTS

| | | | |
|---|---|---|---|
| 3,585,634 | 6/1971 | Sharples | 341/172 |
| 3,906,488 | 9/1975 | Suarez-Gartner | 341/172 |
| 4,065,766 | 12/1977 | Butler et al. | 341/172 |
| 4,250,494 | 2/1981 | Butler et al. | 341/172 |
| 4,621,255 | 11/1986 | Takahashi et al. | |
| 4,647,906 | 3/1987 | Naylor et al. | |
| 4,940,981 | 7/1990 | Naylor et al. | 341/161 |
| 4,947,169 | 8/1990 | Smith et al. | 341/121 |
| 4,965,578 | 10/1990 | Poujois | 341/156 |
| 5,262,779 | 11/1993 | Sauer | 341/161 |
| 5,291,197 | 3/1994 | Abe | 341/141 |
| 5,331,323 | 7/1994 | Yamamoto | 341/136 |

Primary Examiner—Marc S. Hoff
Attorney, Agent, or Firm—Nixon & Vanderhye P.C.

[57] ABSTRACT

A low cost, easily manufactured analog to digital converter uses MOS switching technology easily combined on an integrated circuit with other signal processing circuitry. An input capacitor stores an input analog voltage, and a pumping capacitor is switchably connected to the input capacitor to charge or discharge that input capacitor to a reference value. The number of charge or discharge events is used to generate a digital value for the input analog voltage.

28 Claims, 3 Drawing Sheets

METHOD AND APPARATUS FOR CONVERTING AN ANALOG SIGNAL INTO DIGITAL FORMAT

FIELD OF THE INVENTION

The present invention relates to a method and system for converting an analog signal into digital format, and more particularly, to a low cost, easy to manufacture analog to digital converter.

BACKGROUND AND SUMMARY OF THE INVENTION

Analog to digital conversion is widespread. In one application to digital radios, a high speed analog to digital converter is required to convert speech and other related signals into digital format. In analog (FM) radios, however, the analog to digital conversion requirements are typically less rigorous, (1) because the speech is not digitized, and (2) because the analog signals that are digitized, e.g., signal strength measurements, battery voltage measurements, power amplifier current measurements, etc., do not necessarily have to be digitized at high speed. In fact, the radio microprocessor may monitor received signal strength, battery voltage, power amplifier current, etc. only once every several milliseconds.

To make such a slower speed analog to digital converter for an analog radio, a single analog to digital converter could be coupled to an analog multiplexer that selects one of the various an analog signals to be digitized. For example, an eight input analog multiplexer can have its eight inputs allocated as follows: (1) a reference voltage input ($V_{cc}$), (2) measured received signal strength, (3) measured battery voltage, (4) measured power amplifier current, (5) sensed temperature, (6) the reflected transmitter power, (7) the transmitter voltage controlled oscillator (VCO) voltage, and (8) zero reference voltage (e.g., ground). The multiplexer may then select one input signal to be connected to a grounded capacitor charging it to the voltage of the selected signal. To convert that signal into a digital value, a smaller capacitor connected to the input capacitor may then be used to cyclically remove increments of charge from the input capacitor. The number of increments of charge required to return th e input capacitor to ground potential as detected by a comparator may be stored in a counter. By comparing the counter output obtained when converting the selected voltage with the counter output obtained by converting ground potential or the reference voltage such as $V_{cc}$ during an occasional calibration, the digital value of the input analog signal may be determined.

One drawback with such an arrangement is that it requires a comparator which can detect zero voltage. Conventional, inexpensive comparators do not accurately detect when an input voltage reaches a zero voltage reference because at zero voltage, no current is flowing through the comparator amplifiers. Instead, it is much easier for conventional comparators to compare with a reference voltage which is on the order of halfway between zero voltage and the reference voltage ($V_{cc}$), i.e., $V_{cc}/2$. One approach to making a zero voltage detector is to construct a comparator that uses a negative power supply. However, an additional negative power supply or an additional power converter circuit is a significant drawback in such applications where cost and weight are significant factors as they are in portable, handheld radios.

Another consideration when implementing the analog to digital conversion arrangement described above is the particular type of element used to switch the smaller capacitor in and out of series with the input capacitor. Bipolar junction transistor and diode switches are very sensitive to temperature, therefore making calibration quite difficult. Consequently, it is uncertain what particular digital output will be generated in response to a given input voltage level. Therefore, continuing calibration techniques would have to be used slowing down the analog to digital conversion process as well as adding complexity and expense. For example, it may be necessary to measure on a relatively frequent basis, the number of pulses required to charge or discharge a standard reference voltage before each input voltage is measured to calibrate the selected input voltage by dividing it by the total number of pulses and multiplying it by the reference voltage. Such division and multiplication operations in practice are sufficiently complicated to implement in a binary-based data processing system that they slow down the conversion operation considerably. Bipolar junction transistors are also relatively expensive because most semiconductor foundries manufacture transistors using metal oxide on silicon (MOS) processes.

It is an object of the present invention to construct an analog to digital converter which overcomes the problems noted above.

It is a particular object of the present invention to employ a switching arrangement which uses only MOS switches to remove increments of charge from or add increments of charge to an input capacitor.

It is an object of the present invention to provide a dynamic comparator which effectively compares an input signal to a zero voltage reference without requiring a negative power supply or a power converter to effectively perform that zero voltage detection.

It is also an object of the present invention to provide a low cost analog to digital converter that incrementally removes or adds charge from an input capacitor using only field effect transistor (FET) switches and using a conventional comparator which compares an input signal with a non-zero threshold voltage.

These objects and others are accomplished with an analog to digital converter that includes a first capacitor connected at a first terminal to an input analog signal for a time sufficient to charge the capacitor in accordance with the current voltage level of that analog signal. Electronic circuitry alternately connects a second capacitor between the first capacitor and a power supply to remove increments of charge from the first capacitor until the first capacitor is discharged. The number of removed increments of charge associated with discharging the first capacitor is used to generate a digital value corresponding to the current voltage of the analog signal. An analog multiplexer may be employed for receiving multiple analog signals and selecting one of the received analog signals for connection to the first capacitor. The multiplexer then disconnects the analog signal from the first capacitor after the first capacitor charges to a level commensurate with the current voltage level of the selected analog signal. A comparator detects when the voltage across the first capacitor is zero, and the output of the comparator is used to trigger generation of the corresponding digital value.

Preferably, the switching circuitry that alternately connects the first capacitor to ground and then to the power supply includes first and second pairs of field effect transistor switches. The first pair of FET switches connects between ground and the power supply to charge the second capacitor. The second pair of FET switches connects the second capacitor between the first terminal of the capacitor and ground to remove increments of charge from the first capacitor.

In another embodiment of an analog to digital converter in accordance with the present invention, control circuitry connects to an input capacitor to store an analog input capacitor. Dynamic detection circuitry includes a comparator which ultimately provides a zero voltage level signal to the control circuitry indicating when the input capacitor has discharged to a zero voltage level. Significantly however, the dynamic detection circuitry does not employ a comparator that requires a negative power supply to detect a zero voltage level. Instead, the dynamic detection circuitry processes the input signal stored on the input capacitor such that when that input signal is detected in a conventional comparator as being equal to or greater than a non-zero threshold voltage, the zero voltage level signal is sent to the control circuit.

The dynamic detection circuitry is connected through a pump capacitor to a pumping output signal of the control circuit. The control circuit alternately charges and discharges the pump capacitor using the pumping output signal and discharges the input capacitor by an increment of charge after each charge/discharge cycle of the pump capacitor until the dynamic detection circuitry indicates that the input capacitor is discharged. The total number of incremental charge/discharge cycles of the input capacitor is used to generate a digital value corresponding to the input analog voltage.

Preferably, the dynamic detection circuitry includes first and second field effect transistors (FETs) having a common source electrode connected to the pump capacitor. The gate electrode of the first FET is connected to ground, and the gate electrode of the second FET is connected to the input capacitor. The drain electrodes of the first and second FETs are connected to a power supply with the drain electrode of the second FET also being connected to an input terminal of the comparator. When the pumping signal is in a first logic state, current flows in a first direction from either or both of the first and second FETs through the common source electrodes and the pump capacitor thereby discharging it.

The FETs are preferably formed in a "P-well" semiconductor device readily manufactured using conventional CMOS processes. As a result, the common source connection of the first and second FETs is connected to ground through a diode formed at the P-well and N-substrate interface. When the pumping signal is in a second logic state, current flows in a second direction opposite the first direction through the diode thereby charging the pump capacitor.

The dynamic detection circuitry in this second embodiment of the present invention can be employed advantageously and independently in a method to detect when an input signal reaches a zero voltage level. A first capacitor is charged in accordance with the voltage level of the input signal. A second capacitor is then alternately charged during a first time interval and discharged during a second time interval. During the first time interval, a portion of charge stored on the first capacitor is discharged. During the second time interval, the current voltage across the first capacitor is detected and processed. The processed signal is compared with a non-zero reference voltage. The current voltage across the capacitor is indicated as having reached a zero voltage level when the proposed signal is the same as or greater than the non-zero voltage of the reference voltage. Advantageously, this zero voltage detection method does not require a negative power is supply for the comparator to detect zero. In fact, the comparator threshold may be set halfway between zero voltage and a power supply voltage.

In accordance with another preferred embodiment of the present invention, an analog to digital converter includes a first capacitor connected at a first terminal to an analog signal for a time to charge the capacitor in accordance with the current voltage level of the analog signal. A comparator is connected at one input to the capacitor and another input to a non-zero reference voltage for generating (1) a first signal when the voltage across the first capacitor is greater than the reference voltage, (2) a second voltage when the voltage across the first capacitor is less than the non-zero reference voltage, and (3) a third signal when the voltage across the first capacitor is the same as the non-zero reference voltage. Electronic control circuitry supplies increments of charge to the first capacitor when the voltage across the first capacitor is less than the non-zero voltage until it is the same as the non-zero reference voltage. Alternatively, increments of charge are removed from the first capacitor when the voltage across the first capacitor is greater than the non-zero reference voltage until it is the same as the non-zero reference voltage. The number of charge increments or decrements is counted to generate a digital value corresponding to the current voltage level of the analog signal.

A second capacitor stores the increment or decrement of charge added to or removed from the first capacitor. A plurality of MOS FET switches are connected to the second capacitor and alternately switch the second capacitor between various states depending on the output of the comparator. Thus, this embodiment of the present invention provides a low cost analog to digital converter formed on a semiconductor substrate using metal-oxide-silicon (MOS) technology which may be integrated with other digital MOS circuitry on the same semiconductor substrate that does not require a comparator that detects a zero voltage level.

BRIEF DESCRIPTION OF THE DRAWINGS

The features and advantages of the present invention will be more clearly understood from the following description taken in conjunction with the accompanying drawings in which.

DETAILED DESCRIPTION OF THE INVENTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific circuit details. In other instances, detailed descriptions of well known methodologies, devices, manufacturing processes, and circuits are omitted so as not to obscure the description of the present invention with unnecessary detail.

Figure 1A:
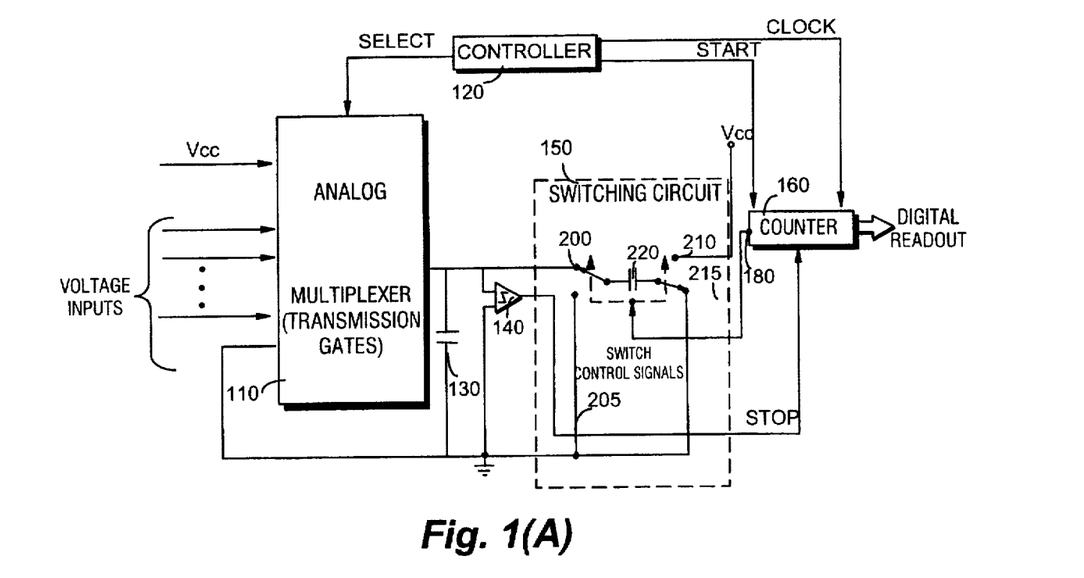
FIGS. 1(A) and 1(B) are schematic diagrams of a first preferred embodiment of the present invention.

FIG. 1(A) illustrates in schematic form a preferred embodiment of an analog to digital converter 100 in accordance with the present invention. An analog multiplexer 110 which may be comprised of a plurality of transmission gates enabled by a select signal from controller 120 receives at its input terminals a plurality of both analog voltage inputs, a positive potential $V_{cc}$, and a zero volts reference potential hereafter referred to as "ground." In accordance with the select signal from controller 120, the analog multiplexer connects one of the inputs to the multiplexer 110 to input capacitor 130 connected at one end to the multiplexer and at the other end to ground. A comparator 140 includes a first input terminal connected to ground, i.e., zero volts, and a second input terminal connected to the first terminal of the input capacitor 130. In this arrangement, comparator 140 detects a zero voltage, either by using a negative supply or a conversion circuit of appropriate sophistication. The comparator 140 output is connected to a digital counter 160 and effectively generates a STOP command when zero volts is detected across capacitor 130.

A second capacitor 220 (referred to hereafter as the "pumping" capacitor) is shown enclosed in the dashed block labeled switching circuit 150. Switching circuit 150 includes a plurality of switches 200, 205, 210, and 215 (shown as nodes) which function in pairs to connect the input capacitor 130 through pumping capacitor 220 to ground or to connect pumping capacitor to the $V_{cc}$. More specifically, switches 200 and 215 function as a first switch pair, and switches 205 and 210 function as a second switch pair.

When the second switch pair 205, 210 is activated to connect the pumping capacitor 220 to $V_{cc}$, pumping capacitor 220 is charged to its full capacity. The value of capacitor 220 is preferably considerably smaller than input capacitor 130 since greater resolution is achieved in the incremental removal of charge from input capacitor 130. In one example, to implement an 8-bit analog to digital converter (an analog to digital converter having a resolution of 8-bits), the input capacitor value should be 256 times the capacitor value of the pumping capacitor 220. In this example, counter 160 should be at least an 8-bit counter. Preferably, a fully charged input capacitor 130 should be capable of being discharged in this example in 256 discharge cycles.

Switch pair 205, 210 charges pumping capacitor 220 with a positive polarity on the right plate connected to switch node 210 and a negative polarity on the left plate connected to switch node 205. As a result of this polarity, when input capacitor 130 is connected via switch pair 200, 215 in series with capacitor 220, capacitor 130 (which is charged to the opposite polarity) discharges by an amount in accordance with the charge stored on pumping capacitor 220.

A counter 160 is connected to receive a start signal and a clock signal that may be generated by controller 120. Of course, the clock signal can be generated from a clock source independent of controller 120. The counting output terminal 180 of counter 160 is in this example embodiment, the switch control signaling which controls the activation of the first and second switch pairs 200, 215 and 205, 210. As the counter transitions from high to low, one set of switch pairs is activated, and as the counter transitions from low to high the other switch pair is activated. When the counter is stopped, it generates a digital readout corresponding to the analog voltage initially stored on input capacitor 130.

In operation, controller 120 enables, via a select signal, one of the transmission gates in the analog multiplexer 110 to connect one of the voltage inputs to input capacitor 120. Thereafter, the voltage input is removed, and the controller 120 transmits a start signal to counter 160. The counter then counts clock signals generating an oscillating counter output control signal at terminal 180 for selectively activating the switch pairs 200, 215 and 205, 210. The initial logic level of the counter control signal activates switches 205 and 210 to connect pumping capacitor 220 to $V_{cc}$. When the counter control signal switches to an opposite logic level with pumping capacitor 220 having been charged, the first switch pair 205, 210 is deactivated and the second switch pair 200, 215 is activated. Since the polarities of the input capacitor 130 and pumping capacitor 220 are opposite, current flows from input capacitor 130 through pumping capacitor 220 to ground discharging input capacitor by an incremental amount corresponding to the charge initially stored across pumping capacitor 220. When the counter output changes back to the initial logic level, the incremental discharge of input capacitor is completed, the second pair of switches 200, 215 is deactivated, and the first pair of switches 205, 210 is again activated to recharge the pumping capacitor 220.

This alternating charge/discharge cycle continues in accordance with the counter control signal with the counter keeping track of the number of clock cycles accumulated since the counter was started. Comparator 140 compares the voltage across input capacitor 130. When the capacitor 130 is substantially discharged, the voltage across capacitor 130 is substantially zero. Such substantially zero voltage is received at the first input terminal of comparator 140 and compared with ground potential. Comparator 140 then generates a "stop" output signal to stop counter 160 if the voltage across capacitor 130 is substantially zero. The counter 160 then outputs the accumulated count value which corresponds to a digital value for the analog input voltage. The larger the input voltage, the larger the amount of charge stored across input capacitor 130, and the greater the number of increments needed to discharge the input capacitor 130. Accordingly, a larger count value represents a larger amplitude analog signal.

Figure 1B:
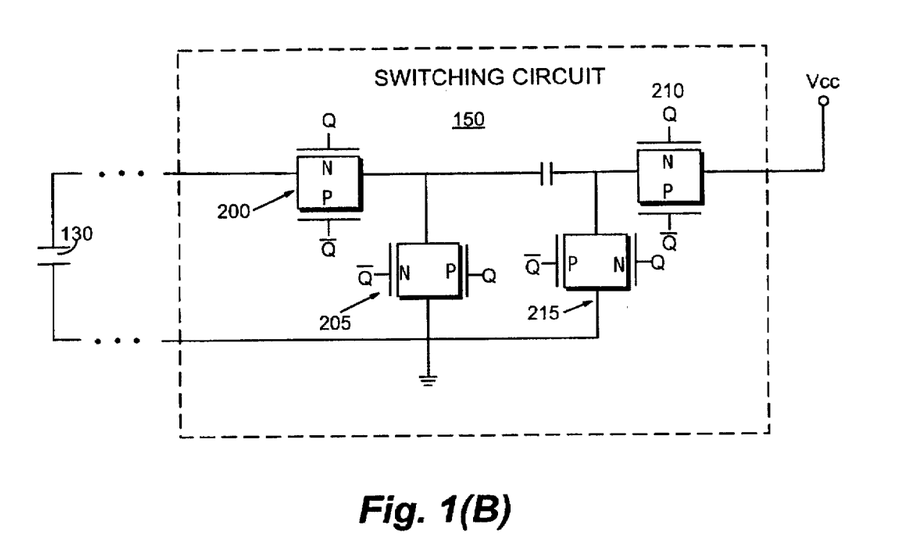

FIG. 1(B) illustrates one example and preferred implementation of the switches 200, 205, 210, 215 employed in switching circuit 150. Specifically, each switch includes a complementary pair of N-type and P-type, insulated gate, field effect transistors (FETs) connected at their respective drains and sources and is termed a "bilateral switch." Each FET has a gate control signal Q or $\overline{Q}$ which controls whether the FET conducts or does not conduct current. For example, the second pair of switches 200 and 215 receive a control signal of logic level Q from counter 160 at the gates of their respective N-type FETs, and an opposite logic state signal $\overline{Q}$ at the gates of their respective P-type FETs. When Q equals a high logic level "1" (e.g., 5 volts), the N-type FETs conduct. Similarly, at the same time, the opposite logic level "0" (corresponding to zero volts) is applied to the gates of P-type FETs which then also conduct. The combined currents flowing through the N-type and P-type FETs result in a near perfect switch which passes all of the current, operates over the full voltage range 0-$V_{cc}$, and provides cancellation of switching glitches due to gate capacitance.

Switches 205 and 210 have gate inputs of the opposite polarity. In other words, the control signal having a logic level of $\overline{Q}$ is applied to the gate terminal of the N-type transistor, and the control signal having a logic level of Q is applied to the gate input of the P-type FET in each complementary switch 205 and 210. When Q=0 and $\overline{Q}$=1, switches 205 and 210 conduct. When Q=1 and $\overline{Q}$=0, switches 200 and 215 conduct. While complementary FET switches are preferred, simple FET switches may also be used satisfactorily.

One of the drawbacks with the embodiments shown in FIGS. 1(A) and 1(B) is the need for a zero voltage level comparator, i.e., comparator 140. As described above, zero-crossing comparators traditionally require a negative supply which requires power conversion circuitry increasing the part count, weight, and cost of the ultimate device, e.g., a radio, or alternatively employ a level of circuit sophistication which also increases cost as well as power consumption. The analog to digital converter shown in FIG. 2 employs dynamic conversion circuitry which permits detection of zero voltage across input capacitor 130 using a conventional comparator 300 that compares an input signal with a non-zero reference voltage, e.g., $V_{cc}/2$. A reference of $V_{cc}/2$ is preferred because that is a voltage in the center of the range in which conventional comparators are designed to detect.

Figure 2:
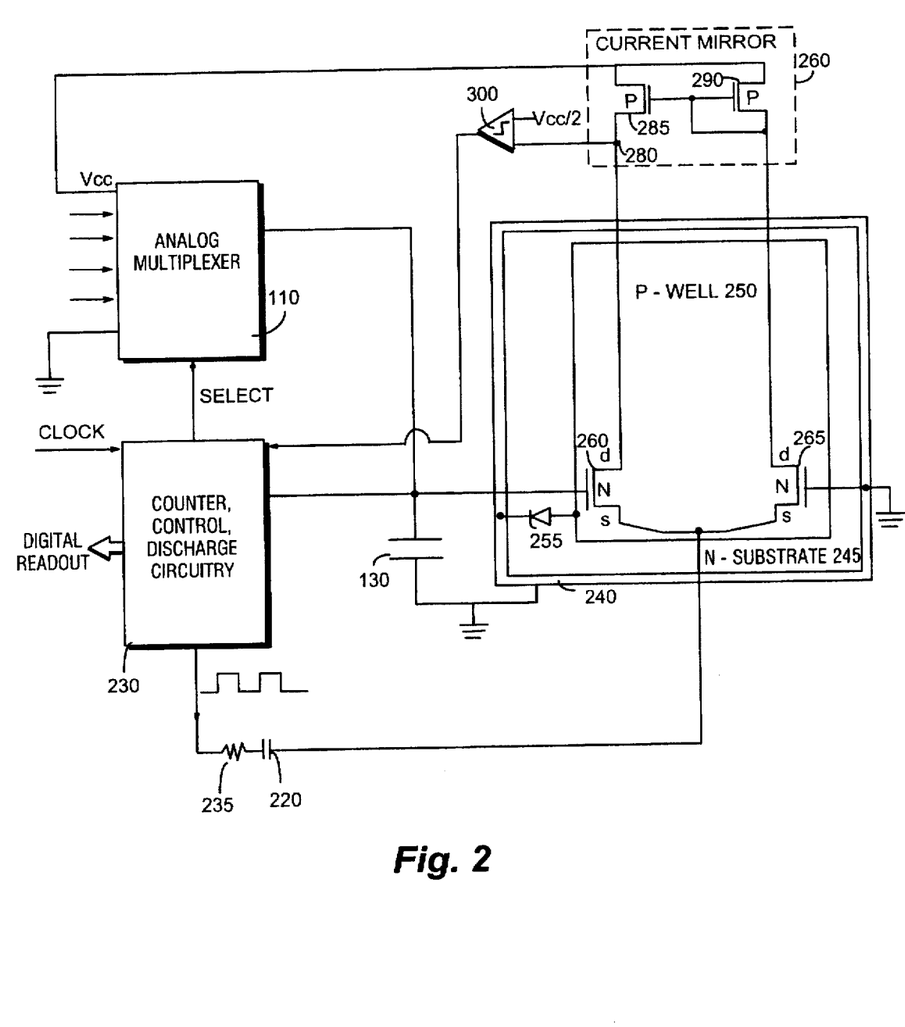
FIG. 2 is a schematic diagram of the present invention in accordance with a second preferred embodiment.

As in the embodiment in FIG. 1, an analog multiplexer 110 receives multiple inputs including ground and a reference voltage $V_{cc}$. A select signal from counter, control, and discharge circuitry 230 enables one of the transmission gates in multiplexer 110 which charges input capacitor 130 to a level commensurate with the current voltage level of the selected input signal. Circuitry 230 receives as inputs a clock signal and an output from comparator 300.

Circuitry 230 generates a digital readout corresponding to the analog voltage level of the selected input signal, a periodic discharge signal to input capacitor 130, and an oscillating counter control signal referred to hereafter as a pump signal. The pump signal is connected through resistor 235 to pumping capacitor 220 which is also connected to the common source connection of FETs 260 and 265. FETs 260 and 265 are N-type FETs which are formed in a "P-well" 250 of P-type semiconductor material diffused into an N-type substrate 245. The substrate 245 is connected to ground via metallized ring 240. The gate terminal of N-type FET 260 is connected to ground, and the gate terminal of N-type FET 260 is connected to the input capacitor 130.

The drains of FETs 260 and 265 are connected preferably (although not necessarily) to a current mirror 260. Current mirror 260 includes two P-type FETs 285 and 290 connect at their respective gates. The sources of P-type transistors 285 and 290 are connected to $V_{cc}$, and their drains are connected to the drains of FET 260 and FET 265, respectively. The common gate connection between FETs 285 and 290 also connects to the drain of FET 290. The drain of FET 285 is connected at node 280 as the input to comparator 300 for comparison with a non-zero reference voltage which in this example embodiment may be $V_{cc}/2$.

In operation, counter, control, and discharge circuitry 230 controls the analog multiplexer 110 to select a voltage input which charges input capacitor 130 to its current voltage level. Circuitry 230 then controls the analog multiplexer 110 to disconnect the input capacitor 130 from all inputs. The pump output (which may for example correspond to the oscillating clock signal) is applied to pump capacitor 220. Initially, the pump signal switches from a zero level voltage to a high level voltage (0 to 1) which charges pumping capacitor 220 through current limiting resistor 235, the common source connection, and the P-N junction diode (indicated symbolically at 255) formed at the interface of the P-well 250 and the N-type substrate 245 to ground. During this cycle, the gate of transistor 265 is connected to ground, and therefore, FET 265 is turned off and does not conduct. Transistor 260 may not be cut off because although its source voltage is at the nominal forward bias voltage of the P-well diode 255 of 0.7 volts, its gate voltage is equal to the input voltage on capacitor 130 which may be greater. However, since transistor 265 does not conduct during this cycle, no current flows through current mirror transistors 285 and 290, and hence, no current can flow through transistor 260. Node 280 is therefore pulled low, i.e., below $V_{cc}/2$ in these circumstances, indicating that the voltage on capacitor 130 is greater than zero.

When the pump signal switches from a high to a low voltage level, the left plate of pump capacitor 220 connected to resistor 235 is pulled to zero volts which (because the voltage across capacitor 220 cannot change instantaneously) forces the right plate of capacitor 220 to a temporary negative voltage. That temporary negative voltage is applied to the common source connection of transistors 260 and 265, and as a result, both transistors can now conduct. Even transistor 265, whose gate is connected to ground, can conduct because if the voltage applied to the source of FET 265 is negative, the voltage between the gate and source is positive which "turns-on" transistor 265.

If the voltage across capacitor 130 is larger then zero, a larger gate voltage is applied to transistor 260 than the gate voltage applied to transistor 265. As a result, more current is "pulled" through transistor 260 than is pulled through transistor 265. At the common source, the currents join to flow through capacitor 220 and dissipating resistor 235. As long as the gate voltage of transistor 260 connected to the input capacitor 130 is greater than the zero gate voltage applied to transistor 265, transistor 260 will conduct more current than transistor 265.

The current flowing in transistor 265 is "mirrored" through transistor 285. Since transistor 285 is an identical P-type transistor with both gate and source connected to the same points as the gate and source of transistor 290, an identical current flows into the drain of transistor 285 which is connected to node 280. Thus, the current mirror 260 "repeats" the drain current of transistor 265 into node 280. At the same time, current through transistor 285 is "pulling" the voltage at node 280 up towards the voltage supply $V_{cc}$ while the current through transistor 260 is "pulling" the voltage at node 280 down. The larger current "wins," and the voltage at node 280 either falls or rises.

As long as the gate of transistor 260 is larger than zero, indicating that the input capacitor 130 is not fully discharged, the voltage at node 280 will be pulled down below the threshold reference voltage $V_{cc}/2$ detected by comparator 300. During the time period when the pump output is at a low level, the output from comparator 300 is read by the counter, control and discharge circuitry 230. When comparator 300 indicates to circuitry 230 that the voltage at node 280 is less than $V_{cc}/2$, (during the low level period of the pump signal), circuitry 230 applies an incremental discharge pulse to input capacitor 130 to remove a single increment of charge. The counter keeps track of the total number of increments of charge removed from input capacitor 130 until the voltage across capacitor 130 is zero. When that occurs, the currents splitting between transistors 260 and 265 equalize which causes the potential at node 280 to rise in voltage until it exceeds the $V_{cc}/2$ threshold detected by comparator 300. The comparator output signal applied to counter, control, and discharge circuitry 230 stops the counter as well as the cyclical application of discharge pulses to input capacitor 130. The final count is output at the digital readout.

This embodiment of the invention provides an inexpensive analog to digital converter which employs a conventional, non-zero level detecting comparator 300 and uses FET switches suitable for integration on a single chip along with the counter, control, and discharge circuitry 230, etc. It also provides an advantageous dynamic zero crossing comparator that does not need a negative supply, and that may be used in a variety of different applications. The signal to be compared with zero is applied to charge up input capacitor 130, and the pump signal is thereafter applied through pump capacitor 220 to transistors 260 and 265. The pumping action applied to transistors 260 and 265 coupled with the current mirror 260 effectively shifts the level of the input voltage. Consequently, when the voltage at node 280 exceeds the non-zero comparator threshold, the output of comparator 300 indicates a zero voltage input. Although transistors 290 and 295 have been shown as preferred elements for performing the current mirror function, other circuit components could also perform this function as well, such as matched drainload resistors.

The use of a current mirror however provides higher voltage gain and thus more accurate zero-crossing detection.

Figure 3:
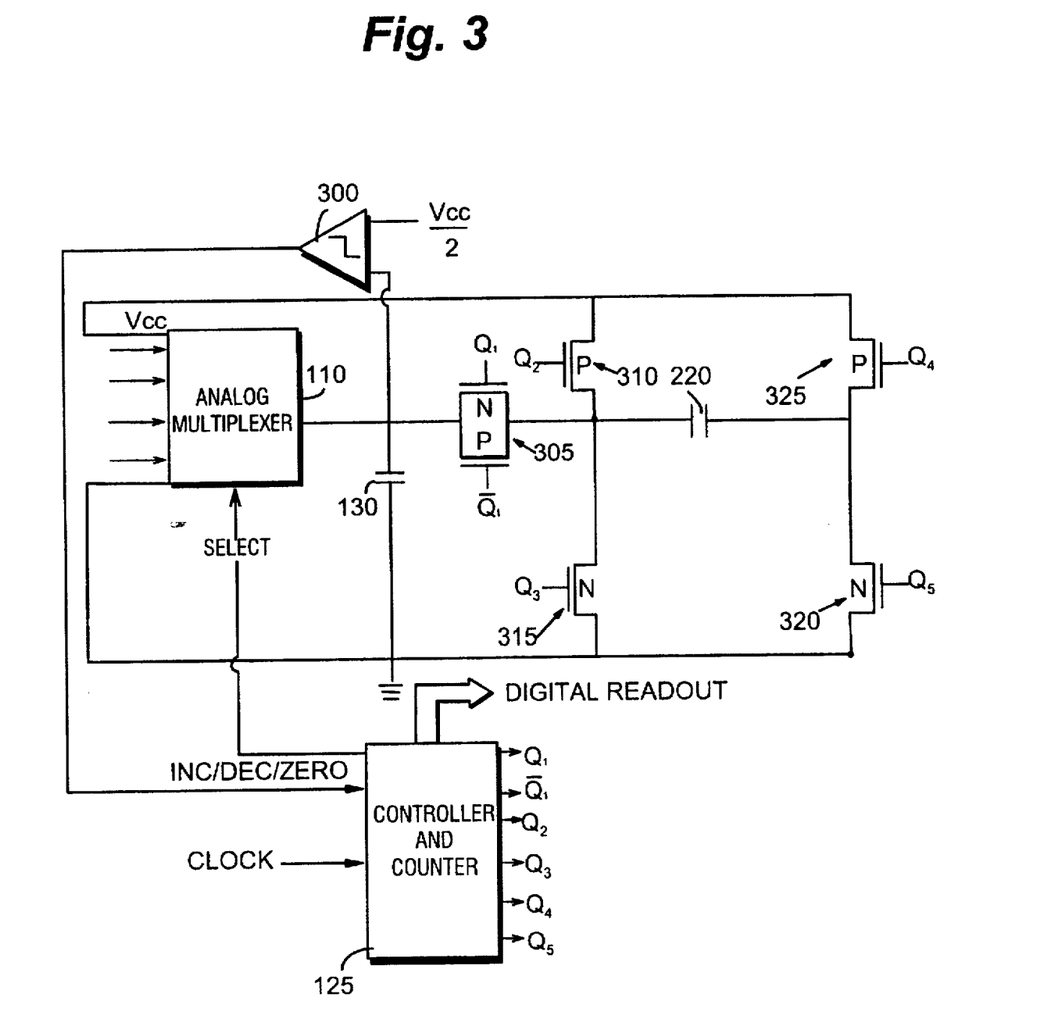
FIG. 3 is a schematic diagram of a third preferred embodiment of the present invention.

Another preferred embodiment of the present invention is now described in conjunction with FIG. 3. FIG. 3 shows a simpler comparator circuit that permits comparison to a threshold, for example, of half the voltage supply ($V_{cc}/2$) thereby avoiding comparison with zero voltage level. As with the embodiments described in FIGS. 1 and 2, the analog multiplexer 110 is controlled by the controller and counter circuit 125 to select an analog voltage input for conversion for connection to input capacitor 130. After capacitor 130 charges to that selected input voltage, the analog multiplexer 110 is open circuited to disconnect capacitor 130.

The control circuit 125 reads the output of comparator 300 to determine if the input voltage across the input capacitor 130 is greater than or less than the $V_{cc}/2$ threshold. If the input voltage is less than the threshold, control circuit 125 operates FET switches 305, 310, 315, 320, and 325 to incrementally pump the charge stored on input capacitor using pumping capacitor 220 until it reaches the threshold voltage $V_{cc}/2$. Conversely, if the input voltage initially was above the threshold $V_{cc}/2$, the control circuit 125 operates the FET switches to incrementally pump down the voltage stored across input capacitor 130 until it crosses the $V_{cc}/2$ threshold as indicated by the output of comparator 300.

Assuming that the initial comparator output indicates that the input voltage is less than the threshold voltage $V_{cc}/2$, the following control signals generated by controller 125 are applied to the gates of the FET switches. Initially, Q1=0 and $\overline{Q1}$=1 which causes the FET switch 305 to disconnect the input capacitor 130 from the pumping capacitor 220. Q2 is set equal to 0 to apply a low level to P-type FET 310 so that it conducts connecting the leftmost plate of pumping capacitor 220 to $V_{cc}$. At the same time, Q5 is set equal to 1 so that the N-type FET 320 conducts connecting the right plate of pumping capacitor 220 to ground. This switch configuration charges the pumping capacitor 220 to $V_{cc}$ with positive polarity on the left plate and zero polarity on the right plate of the capacitor.

Thereafter, Q2 and Q5 are set equal to 1 to "turn off" FET switches 310 and 320. Q4 is then set equal to 0 which causes P-type FET 325 to conduct, pulling the rightmost plate of pumping capacitor 220 to $V_{cc}$. Because of conservation of charge, the potential on the right hand plate of pumping capacitor 220 rising from 0 to $V_{cc}$ attempts to force the potential on the left plate of capacitor 220 to rise to $2V_{cc}$ in order to maintain the immediately preceding potential difference of $V_{cc}$ across capacitor 220. At the same time, Q1 is set equal to 1 and $\overline{Q}$ equal to 0 activating switch 305 to connect the left plate of capacitor 220 to input capacitor 130. The difference between $2V_{cc}$ stored across capacitor 220 and the voltage across input capacitor 130, (which is somewhere between zero and $V_{cc}/2$), multiplied by the capacitance value of capacitor 220 determines the amount of charge transferred from pumping capacitor 220 to input capacitor C11. Thus in this example, the voltage across input capacitor 130 rises by an incremental amount between ($1.5 V_{cc} \times C220/C130$) and ($2.0 V_{cc} \times C220/C130$).

If the initial voltage stored across input capacitor 130 is greater than $V_{cc}/2$, the input capacitor 130 is pumped down using the following example procedures. Initially, Q1 is set equal to 0 and $\overline{Q}$ equal to 1 to disconnect input capacitor 130 from pumping capacitor 220. The gate voltage applied to N-type FET 315 is set equal to 1 so that FET 315 conducts connecting the left plate of pumping capacitor 220 to ground. At the same time, the gate voltage applied to P-type FET 325 is set equal to 0 which effectively connects the right plate of pumping capacitor 220 to the power supply voltage $V_{cc}$ charging pumping capacitor 220 to a potential of $V_{cc}$ with positive polarity on the right plate and zero polarity on the left plate. Thereafter, gate voltage Q3 is set equal to 0 and Q4 is set equal to 1 to turn-off FETs 315 and 325.

Gate voltage Q5 is then set equal to 1 to turn-on N-type FET 320, connecting pumping capacitor 220 to ground which pulls the voltage on the right plate of capacitor from $V_{cc}$ to zero. Conservation of charge requires that the potential on the left plate of capacitor 220 attempt to move from 0 to $-V_{cc}$ in order to maintain the initial voltage drop of $V_{cc}$ across capacitor 220. At the same time, gate voltage input Q1 is set equal to 1 and $\overline{Q}$ is set equal to 0, connecting the left plate of pumping capacitor 220 to input capacitor 130. The difference between the voltage across capacitor 220 and the voltage stored on input capacitor 130 (which is somewhere between $V_{cc}/2$ and $V_{cc}$) times the pumping capacitance gives the amount of incremental charge transferred from capacitor 220 to input capacitor 130. As a result of the charge transfer, the voltage across input capacitor is reduced by an incremental amount between ($1.5 V_{cc} \times C220/C100$) and ($2.0 V_{cc} \times C220/C130$).

This embodiment of the present invention provides an analog to digital converter which uses FET switches to pump an input voltage below a non-zero reference voltage up to that reference voltage or to pump a voltage above the non-zero reference voltage down to the reference voltage thereby obtaining symmetrical control about a nonzero reference voltage. The incremental step size for pumping up or pumping down the input capacitor C130 is slightly dependent upon the input voltage but in a symmetrical way that provides greater resolution (finer steps) in the center of the analog to digital convertor's useful range, (e.g., $V_{cc}/2$), with less resolution (coarser steps) at the extremes of the range, (e.g., zero and $V_{cc}$). This is advantageous because most voltages to be measured by the A to D convertor would first be arranged by suitable scaling to fall with the greatest probability in the center of the A to D convertor range, where the inventive circuit provides highest accuracy.

Although MOS-type switches are preferred for their low cost, ease of manufacture, and superior response with respect to other electronic switches, other switches including bipolar junction transistors or technologies such as GaAs could be used to implement switching functions in the present invention. Thus, the present invention provides a low cost, easily manufactured analog to digital converter which uses MOS switching technology and can be combined on an integrated circuit with other signal processing circuitry.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An analog to digital converter, comprising:
   a first capacitor connected at a first terminal to an analog signal to charge the capacitor in accordance with a current voltage level of the analog signal and at a second terminal to ground;
   a second capacitor; and
   electronic control circuitry for alternately connecting the second capacitor between the first capacitor and a power supply to remove increments of charge from the first capacitor until the first capacitor is discharged including:
      a switching circuit connected to the first terminal of the first capacitor, to ground, and to the power supply including:
         a first pair of switches with one switch connected to a first terminal of the second capacitor and the other switch connected to a second terminal of the second capacitor, and
         a second pair of switches with one switch connected to a first terminal of the second capacitor and the other switch connected to a second terminal of the second capacitor,
      wherein the electronic control circuitry generates switching control signals alternately connecting the second capacitor through the first pair of switches between ground and the power supply and through the second pair of switches between the first terminal of the first capacitor and ground to remove the increments of charge from the first capacitor, and
      wherein a number of removed increments of charge associated with discharging the first capacitor is used to generate a digital value corresponding to the current voltage level of the analog signal.

2. The analog to digital converter in claim 1, further comprising:
   a multiplexer for receiving multiple analog signals and selecting one of the received analog signals for connection to the first capacitor in response to a control signal received from the electronic control circuitry,
   wherein after the first capacitor charges to a level commensurate with the current voltage level of the selected analog signal, the electronic control circuitry causes the multiplexer to disconnect the analog signal from the first capacitor.

3. The analog to digital converter in claim 1, further comprising:
   a comparator having one input connected to the first terminal of the first capacitor and another input connected to ground for detecting when the voltage across the first capacitor is at or nearly zero and then generating a detection signal causing the electronic control circuitry to generate the digital value.

4. The analog to digital converter in claim 2, further comprising a clock source, wherein the electronic control circuitry includes a counter for counting clock pulses generated by the clock source from a predetermined starting point after the first capacitor is charged until the detection signal is received from the comparator halts the counting, with the digital readout from the counter corresponding to the digital value.

5. The analog to digital converter in claim 1, wherein each switch in the first and second pairs of switches is a complementary semiconductor switch having an N-type, insulated gate, field effect transistor (FET) and a P-type, insulated gate, field effect transistor (FET).

6. The analog to digital converter in claim 1, further comprising:
   a clock source for generating clock signals,
   the electronic control circuitry including a counter for counting the clock signals and generating a counter output signal that alternates between a first state and a second state,
   wherein the switching control signals include the counter output signal such that the first pair of switches is selected to connect the second capacitor between ground and the power supply when the counter output is in the first state and the second pair of switches is selected to connect the second capacitor between the first terminal of the first capacitor and ground.

7. An analog to digital converter comprising:
   an input capacitor connected at a first terminal to store an analog voltage and at a second terminal to ground;
   control circuitry connected to the input capacitor at the first terminal;
   dynamic detection circuitry connected to the first terminal of the input capacitor for determining whether an input signal applied to a first input terminal of a comparator generated in response to the voltage across the input capacitor is equal to or greater than a nonzero, threshold voltage applied to a second input terminal of the comparator and for providing an output signal from the comparator to the control circuit indicating whether the input capacitor is discharged,
   wherein said dynamic detection circuitry is connected through a pump capacitor to a pump output signal of the control circuitry, the control circuitry alternately charging and discharging the pump capacitor using the pump output signal and discharging the input capacitor by an increment of charge after each charge and discharge cycle of the pump capacitor, until the dynamic detection circuitry indicates that the input capacitor is discharged, a total number of incremental discharges of the input capacitor being used to generate a digital value for the analog voltage.

8. The analog to digital converter in claim 7, wherein the control circuit includes a counter for counting the number of incremental discharges to provide a digital code corresponding to a final count value.

9. The analog to digital converter in claim 7, further comprising:
   a multiplexer for receiving multiple analog signals and selecting one of the received analog signals for connection to the input capacitor in response to a control signal received from the control circuit,
   wherein after the input capacitor charges to a level commensurate with the current voltage level of the selected analog signal, the control circuit causes the multiplexer to disconnect the analog signal from the input capacitor.

10. The analog to digital converter in claim 7, further comprising:
    a resistor connected in series with the pump capacitor between the control circuit and the dynamic detector.

11. The analog to digital converter in claim 7, wherein the dynamic detection circuitry includes a first field effect transistor (FET) having a gate electrode connected to ground and a second field effect transistor (FET) having a gate electrode connected to the first terminal of the first capacitor with drain electrodes being connected to a power supply, the first and second FETs having a common source electrode connected to the pump capacitor, and a drain electrode of the second FET connected to the first input terminal of the comparator.

12. The analog to digital converter in claim 11, wherein when the pump signal is in a first logic state, current flows in a first direction from either or both of the first and second FETs from the common source electrodes through the pump capacitor discharging the pump capacitor, and wherein the comparator compares a voltage at the first input terminal with the nonzero, threshold voltage during a comparison time interval when the pump signal is in the first logic state.

13. The analog to digital converter in claim 12, wherein the common source is connected by a diode to ground such that when the pump signal is in a second logic state, current flows in a second direction opposite the first direction through the diode to charge up the pump capacitor, and wherein during a discharge time interval when the pump signal is in the second logic state, the control circuit discharges the input capacitor by an increment discharge if the comparator indicates during an immediately preceding comparison time interval that the input capacitor is not discharged.

14. The analog to digital converter in claim 11, wherein the dynamic detection circuitry further includes a current mirror circuit connected between the drain electrodes of the first and second FETs and the power supply.

15. The analog to digital converter in claim 14, wherein the current mirror includes a third FET connected at its source electrode to a voltage supply and at its drain electrode to the second FET and to the first input terminal of the comparator and a fourth FET connected at its source electrode to the power supply, at its drain electrode to the drain electrode to the drain electrode of the first FET, and at its gate electrode to the a gate electrode of the third FET and to the drain electrode of the fourth FET.

16. The analog to digital converter in claim 11, wherein the first and second transistors are formed in a well of a first conductivity type diffused into a substrate of a second conductivity type.

17. An analog to digital converter, comprising:

a first capacitor connected at a first terminal to an analog signal to charge the capacitor in accordance with a current voltage level of the analog signal and at a second terminal to ground;

a comparator having one input terminal connected to the first terminal of the first capacitor and another input terminal connected to a reference voltage for generating:

(a) a first signal when the voltage across the first capacitor is greater than the reference voltage, (b) a second signal when the voltage across the first capacitor is less than the reference voltage, and (c) a third signal when the voltage across the first capacitor is the same as the reference voltage; and electronic control circuitry for supplying increments of charge to the first capacitor when the second signal is generated until the third signal is generated and for removing increments of charge from the first capacitor when the first signal is generated until the third signal is generated, wherein the electronic control circuitry counts a number of charge increments or decrements to generate a digital value corresponding to the current voltage level of the analog signal.

18. The analog to digital converter in claim 17, further comprising:

a second capacitor for storing the increment of charge, and a plurality of switches connected to the second capacitor, wherein the electronic control circuitry alternately switches the second capacitor between various states depending on the output from the comparator.

19. The analog to digital converter in claim 17, wherein when the comparator generates the first signal, the electronic control circuitry generates control signals to successively activate switches to connect the second capacitor between a power supply and ground and then to connect the second capacitor to the first capacitor thereby removing increments of charge from the first capacitor until the third signal generated.

20. The analog to digital converter in claim 19, wherein each switch is an insulated gate, field effect transistor (FET).

21. The analog to digital converter in claim 17, wherein when the comparator generates the second signal, the control circuitry generates control signals to activate switches to successively connect the second capacitor between a power supply and ground and then to connect the second capacitor to the first capacitor to add increments of charge from the first capacitor until the third signal generated.

22. The analog to digital converter in claim 21, wherein each switch is an insulated gate, field effect transistor (FET).

23. The analog to digital converter in claim 17, wherein the reference voltage is a nonzero voltage.

24. The analog to digital converter in claim 17, further comprising:

a multiplexer for receiving multiple analog signals and selecting one of the received analog signals for connection to the first capacitor in response to a control signal received from the electronic control circuitry, wherein after the first capacitor charges to a level commensurate with the current voltage level of the selected analog signal, the electronic control circuitry causes the multiplexer to disconnect the analog signal from the first capacitor.

25. A method for converting an analog signal into a digital signal comprising the steps of:

charging a first capacitor in accordance with a current voltage level of the analog signal;

comparing the voltage across the first capacitor to a reference voltage;

supplying increments of charge to the first capacitor when a voltage across the capacitor is less than a reference voltage and removing increments of charge when the voltage across the first capacitor is greater than the reference voltage; and counting a number of the charge increments or decrements to generate a digital value corresponding to the current voltage level of the analog signal.

26. The method in claim 25, wherein the increments of charge are supplied until the charge across the first capacitor is the same as the reference voltage.

27. The method in claims 25, wherein the increments of charge are removed until the charge across the first capacitor is the same as the reference voltage.

28. The method in claim 25, further comprising the step of:

discontinuing supplying increments of charge when the first capacitor is discharged and then performing the counting step.

* * * * *